United States Patent
Shukh

(10) Patent No.: US 9,368,176 B2
(45) Date of Patent: Jun. 14, 2016

(54) SCALABLE MAGNETORESISTIVE ELEMENT

(71) Applicant: Alexander Mikhailovich Shukh, San Jose, CA (US)

(72) Inventor: Alexander Mikhailovich Shukh, San Jose, CA (US)

( * ) Notice: Subject to any disclaimer, the term of this patent is extended or adjusted under 35 U.S.C. 154(b) by 41 days.

(21) Appl. No.: 14/272,505

(22) Filed: May 8, 2014

(65) Prior Publication Data

US 2014/0242418 A1     Aug. 28, 2014

Related U.S. Application Data

(63) Continuation-in-part of application No. 13/452,166, filed on Apr. 20, 2012, now Pat. No. 8,758,909.

(60) Provisional application No. 61/821,090, filed on May 8, 2013.

(51) Int. Cl.
G01R 33/09     (2006.01)
G11C 11/16     (2006.01)

(52) U.S. Cl.
CPC ............ *G11C 11/161* (2013.01); *G01R 33/093* (2013.01); *G01R 33/098* (2013.01); *Y10T 428/1114* (2015.01)

(58) Field of Classification Search
None
See application file for complete search history.

(56) References Cited

U.S. PATENT DOCUMENTS

| | | | |
|---|---|---|---|
| 5,640,343 A | 6/1997 | Gallagher et al. | |
| 6,256,223 B1 | 7/2001 | Sun | |
| 6,628,542 B2 | 9/2003 | Hayashi et al. | |
| 6,721,201 B2 | 4/2004 | Ikeda | |
| 6,844,605 B2 | 1/2005 | Nishimura | |
| 7,307,302 B2 | 12/2007 | Saito | |
| 7,313,013 B2 | 12/2007 | Sun et al. | |
| 7,432,574 B2 | 10/2008 | Nakamura et al. | |
| 7,598,555 B1 | 10/2009 | Parkin | |
| 7,602,000 B2 | 10/2009 | Sun et al. | |
| 7,663,197 B2 | 2/2010 | Nagase et al. | |
| 7,787,288 B2 | 8/2010 | Kitagawa et al. | |
| 7,894,245 B2 | 2/2011 | Sun et al. | |

(Continued)

OTHER PUBLICATIONS

Yamamoto H. et al., Applied Physics Express 5, 053002 (2012).

(Continued)

*Primary Examiner* — Kevin Bernatz

(57) ABSTRACT

One embodiment of a magnetoresistive element comprises: a free ferromagnetic layer comprising a reversible magnetization direction directed substantially perpendicular to a film surface in its equilibrium state; a pinned ferromagnetic layer comprising a fixed magnetization direction directed substantially perpendicular to the film surface; a nonmagnetic tunnel barrier layer disposed between the free ferromagnetic layer and the pinned ferromagnetic layer and having a direct contact with the free and pinned ferromagnetic layers; a first nonmagnetic conductive layer disposed adjacent to and having a direct contact with a side of a free ferromagnetic layer opposite to the tunnel barrier layer; and a second nonmagnetic conductive layer disposed adjacent to a side of the pinned ferromagnetic layer opposite to the tunnel barrier layer, wherein the free ferromagnetic layer and the pinned ferromagnetic layers comprise at least one element selected from the group consisting of Fe, Co, and Ni, at least one element selected from the group consisting from V, Cr, and Mo, and at least one element selected from the group consisting of B, P, C, and Si, and wherein the first nonmagnetic conductive layer comprises an oxide. Other embodiments are described as shown.

7 Claims, 3 Drawing Sheets

(56) References Cited

U.S. PATENT DOCUMENTS

| | | | |
|---|---|---|---|
| 7,924,607 B2 | 4/2011 | Yoshikawa et al. | |
| 8,072,800 B2* | 12/2011 | Chen | B82Y 25/00 360/324.11 |
| 8,247,093 B2* | 8/2012 | Rodmacq | B82Y 25/00 365/173 |
| 8,917,541 B2* | 12/2014 | Ohno | H01L 43/08 365/158 |
| 9,177,574 B2* | 11/2015 | Fuji | G01R 33/093 |
| 2010/0102406 A1* | 4/2010 | Xi | B82Y 25/00 257/421 |
| 2012/0012953 A1* | 1/2012 | Lottis | B82Y 25/00 257/421 |
| 2012/0020152 A1* | 1/2012 | Gaudin | G11C 11/16 365/171 |
| 2012/0069642 A1 | 3/2012 | Ueda et al. | |
| 2012/0206837 A1* | 8/2012 | Fuji | G01R 33/093 360/254 |
| 2012/0261777 A1* | 10/2012 | Shukh | H01L 43/08 257/421 |
| 2012/0280336 A1* | 11/2012 | Jan | H01L 43/08 257/421 |
| 2013/0010532 A1 | 1/2013 | Nagase et al. | |
| 2013/0078482 A1* | 3/2013 | Shukh | G11B 5/3909 428/811.1 |
| 2013/0141966 A1* | 6/2013 | Ohno | G11C 11/16 365/158 |
| 2013/0221460 A1* | 8/2013 | Jan | H01L 43/10 257/421 |
| 2013/0242435 A1* | 9/2013 | Fuji | G01R 33/093 360/244 |
| 2015/0188036 A1* | 7/2015 | Huai | G11C 11/16 257/421 |

OTHER PUBLICATIONS

Bruno P. and J.-P.Renard, Applied Physics A, v. 49, p. 499-506 (1989).
Parkin S.S.P., Phys. Rev. Letters, v.67, p. 3598 (1991).
Johnson M.T. et al., Rep. Prog. Phys., v.59, p. 1409-1458 (1996).
Vouille C. et al., J. Appl. Physics, v.81, p. 4573-4575 (1997).
Szunyogh L. et al., Rhysical Review B, v.57, p. 8838-8841 (1998).
Choi Y.S. et al., J. Appl. Physics, v.101, 013907 (2007).
Bondi F. et al., IEEE Transactins on Magnetics, v.45, p. 3467 (2009).
Ikeda S. et al., Nature Materials, v.9, p. 721-724 (2010).
Worledge D.C. et al., Appl. Phys. Letters, v.98, 022501 (2011).
US 7,529,121, 5/2009, Kitagawa et al. (withdrawn).
Liu T. et al., AIP Advances 2, 032151 (2012).
Ikeda S. et al., IEEE Trans.Magn. v.48, p. 3839 (2012).

* cited by examiner

SCALABLE MAGNETORESISTIVE ELEMENT

CROSS-REFERENCE TO RELATED APPLICATIONS

This application is a continuation-in-part of U.S. patent application Ser. No. 13/452,166 filed on Apr. 20, 2012 and claims the benefit of provisional patent application No. 61/821,090 filed on May 8, 2013, the entire contents of each are incorporated herein by reference.

FEDERALLY SPONSORED RESEARCH

Not Applicable

SEQUENCE LISTING OR PROGRAM

Not Applicable

Relevant Prior Art

Kitagawa et al., U.S. Pat. No. 7,529,121, May 5, 2009
Nagase et al., U.S. Pat. No. 7,663,197, Feb. 16, 2010
Yoshikawa et al., U.S. Pat. No. 7,924,607, Apr. 12, 2011
Ueda et al., Patent Application Pub. No. US 2012/0069642, Mar. 22, 2012
Nagase et al., Patent Application Pub. No.: US 2013/0010532, Jan. 10, 2013

BACKGROUND

Magnetic (or magnetoresistive) random access memory (MRAM) using magnetoresistive (MR) elements (or magnetic tunnel junctions (MTJs)) is a strong candidate for providing a dense, scalable and non-volatile storage solution for future memory applications. MRAM is capable to provide a high speed writing and low operation power. In particular, these parameters can be achieved in the MRAM employing a spin-induced writing mechanism in MTJ with a perpendicular anisotropy.

Each MTJ (or MR element) of MRAM comprises at least a pinned (reference) magnetic layer with fixed direction of magnetization and a free (storage) magnetic layer with reversible direction of the magnetization. The free and pinned ferromagnetic layers are separated from each other by a thin tunnel barrier layer made of insulator or semiconductor. The free layer works as a storage layer and can have two stable directions of the magnetization that is parallel or anti-parallel to the direction of the magnetization of the pinned layer. Resistance of the MTJ measured in a direction across the tunnel barrier layer thickness depends on a mutual orientation of the magnetization directions in the free and pinned layers. It can be effectively controlled by a direction of the spin-polarized switching current running across the MTJ perpendicular to tunnel barrier layer plane. The spin-polarized current can reverse the magnetization direction of the free layer. The resistance is low when the magnetization directions of the free and pinned layers are parallel to each other (logic "0") and high when the magnetization directions are antiparallel to each other (logic "1"). Difference in the resistance between two logic states can be in a range of about 1000% at room temperature.

A typical MRAM device includes an array of memory cells, word lines extending along rows of the memory cells and bit lines extending along columns of the memory cells. Each memory cell is located at a cross point of a word line and a bit line in a vertical space between them. The cell typically comprises an MTJ and a selection transistor (or other nonlinear element) connected in series.

The MTJ comprising magnetic layers made of materials having a perpendicular anisotropy (or perpendicular direction of magnetization in an equilibrium state) can provide a substantial thermal stability ($\Delta \geq 60$). The thermal stability can be estimated from the following equation $$\Delta = K_U V / k_B T, \quad (1)$$

where $K_U$ and V is a magnetic anisotropy and volume of the free layer, respectively, $k_B$ is a Boltzmann constant, and T is a temperature.

Low density of the spin-polarized switching current ($J_S \leq 1 \cdot 10^6$ A/cm$^2$) and high tunneling magnetoresistance (TMR $\geq 150\%$) originate from a coherent spin-dependent tunneling of highly spin-polarized electrons. They can be achieved in the perpendicular MTJ comprising a coherent body-centered (bcc) structures with (001) planes oriented in the adjacent free, tunnel barrier and pinned layers. The coherent bcc (001) structure can also provide a low magnetic damping constant ($\alpha \leq 0.01$).

Free layer of the perpendicular MTJ can be made of magnetic materials having a substantial perpendicular magnetic anisotropy (PMA). There are several groups of the perpendicular magnetic materials which include ordered alloys (FePt, CoPt, FePd, and the like), rare earth-transition metal (RE-TM) alloys (GdFeCo, TbFeCo, TbCo, and the like), and laminates (CoFe/Pd, CoFeB/Pt, Co/Pt, Co/Pd, and the like). These materials can suffer from a significant damping constant $\alpha \geq 0.01$ and reduced spin polarization p which cause a substantial increase of the switching current density $J_S$. Some of the these materials cannot provide the required coherent bcc (001) structure of the MTJ, or cannot tolerate a high temperature annealing ($T_{AN} \geq 250°$ C.) due to possible loss of the perpendicular anisotropy or unwanted diffusion in the tunnel barrier layer.

CoFeB/MgO/CoFeB multilayer became a system of choice for MTJ manufacturing since it can provide the required coherent bcc (001) texture in MgO and adjacent crystallized CoFe(B) layers. However this structure may not support the perpendicular direction of the magnetization in the free and pinned layers. The PMA in the CoFeB-based free and pinned layers can be provided by a magnetic surface anisotropy produced at the interfaces of the CoFeB layers with other materials, for example MgO. However a magnitude of the PMA produced at the CoFeB/MgO interface may be not sufficient to support the perpendicular direction of the magnetization in the crystallized CoFe(B) layer having a thickness of about 1 nm and above. Recent demonstrations of the PMA in the annealed Ta/CoFeB/MgO multilayers provided a possibility to increase thickness of the free layer up to about 1.3 nm. This thickness may be not sufficient for providing the required thermal stability of the perpendicular MTJs having a diameter less than 40 nm.

SUMMARY

Disclosed herein is a magnetoresistive element that includes a free ferromagnetic layer comprising a first reversible magnetization direction directed substantially perpendicular to a film surface, a pinned ferromagnetic layer comprising a second fixed magnetization direction directed substantially perpendicular to the film surface, and a nonmagnetic insulating tunnel barrier layer disposed between the free ferromagnetic layer and the pinned ferromagnetic layer and having a direct contact with the ferromagnetic layers, wherein the free ferromagnetic layer and the pinned ferromagnetic layers contains at least one element selected from the group consisting of Fe, Co, and Ni, at least one element selected from the group consisting from V, Cr, and Mo, and at least one element selected from the group consisting of B, P, C, and Si, and wherein the free ferromagnetic layer, the tunnel barrier layer, and the pinned ferromagnetic layer have a coherent body-centered cubic (bcc) structure with a (001) plane oriented, and a bidirectional spin-polarized current passing through the coherent structure in a direction perpendicular to the film surface reverses the magnetization direction of the free ferromagnetic layer.

Also disclosed is a magnetoresistive element that includes a free ferromagnetic layer comprising a first reversible magnetization direction directed substantially perpendicular to a film surface, a pinned ferromagnetic layer comprising a second fixed magnetization direction directed substantially perpendicular to the film surface, a nonmagnetic insulating tunnel barrier layer disposed between the free ferromagnetic layer and the pinned ferromagnetic layer and having a direct contact with the ferromagnetic layers, a first nonmagnetic metal layer disposed contiguously to a side of the free ferromagnetic layer opposite to the tunnel barrier layer, and a second nonmagnetic metal layer disposed contiguously to a side of the pinned ferromagnetic layer opposite to the tunnel barrier layer, wherein the first nonmagnetic metal layer and second nonmagnetic metal layer contains at least one element selected from the group consisting of Ta, W, Nb, Mo, V, and Cr, and the free ferromagnetic layer and the pinned ferromagnetic layers contains at least one element selected from the group consisting of Fe, Co, and Ni, at least one element selected from the group consisting from V, Cr, and Mo, and at least one element selected from the group consisting of B, P, C, and Si, and wherein the free layer, the tunnel barrier layer, and the pinned layer form a coherent body-centered cubic (bcc) structure with a (001) plane oriented, and a bidirectional spin-polarized current passing through the coherent structure in a direction perpendicular to the film surface reverses the magnetization direction of the free layer.

BRIEF DISCRIPTION OF THE DRAWINGS

EXPLENATION OF REFERENCE NUMERALS

Figure 1:
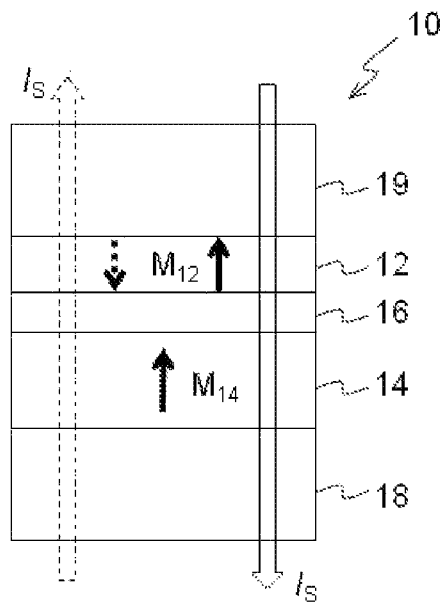
FIG. 1 shows a schematic sectional view of a magnetic tunnel junction with a perpendicular magnetic anisotropy according to an embodiment of the present disclosure.

10, 20, 30, 40, 50 magnetoresistive element (or magnetic tunnel junction)
12 free (or storage) ferromagnetic layer
14 pinned ferromagnetic layer
16 tunnel barrier layer
18 seed layer (or underlayer)
19 cap layer (or overlayer)
22, 24 interface layer
32 reference magnetic layer
34 pinning magnetic layer
36 nonmagnetic spacer layer
51, 52 magnetic sublayers
53 nonmagnetic spacer sublayer

DETAILED DESCRIPTION

Embodiments of the present disclosure will be explained below with reference to the accompanying drawings. Note that in the following explanation the same reference numerals denote constituent elements having almost the same functions and arrangements, and a repetitive explanation will be made only when necessary. Since, however, each figure is an exemplary view, it should be noted that the relationship between the thickness and planar dimensions, the ratio of the thicknesses of layers, and the like are different from the actual ones. Accordingly, practical thicknesses and dimensions should be judged in consideration of the following explanation.

Note also that each embodiment to be presented below merely discloses an device for embodying the technical idea of the present disclosure. Therefore, the technical idea of the present disclosure does not limit the materials, shapes, structures, arrangements, and the like of constituent parts to those described below. The technical idea of the present disclosure can be variously changed within the scope of the appended claims.

Refining now to the drawings, FIGS. 1-5 illustrate exemplary aspects of the present disclosure. Specifically, these figures illustrate MR element having a multilayer structure with a perpendicular anisotropy in magnetic layers. The direction of the magnetization in the magnetic layers are shown by solid or dashed arrows. The MR element can store binary data by using steady logic states determined by a mutual orientation of the magnetization directions in the magnetic layers separated by a tunnel barrier layer. The logic state "0" or "1" of the MR element can be changed by a spin-polarized current running through the element in the direction perpendicular to layers surface (or substrate), by an external magnetic field, or by a combination of the spin-polarizing current with the magnetic field. The MR element may be included as a part of magnetic random access memory (MRAM).

The MR element herein mentioned in this specification and in the scope of claims is a general term of a tunneling magnetoresistance (TMR) element using a nonmagnetic insulator or semiconductor as the tunnel barrier layer. Although the following figures each illustrate the major components of the MR element, another layer may also be included as long as the arrangement shown in the figure is included.

FIG. 1 shows a schematic sectional view of a magnetic tunnel junction (MTJ) 10 with a perpendicular magnetic anisotropy in magnetic layers according to an embodiment of the present disclosure. The MTJ 10 comprises a free layer 12, a pinned layer 14, a tunnel barrier layer 16, a seed layer 18, and a cap layer 19. The free 12 and pinned 14 layers have a magnetization directions $M_{12}$ and $M_{14}$ (shown by arrows), respectively, that are directed perpendicular to a layer plane (film surface). The layers 12 and 14 can be made by a sputter disposition in a vacuum of $(Fe_{70}Co_{20}V_{10})_{85}B_{15}$ alloy and have a substantially amorphous structure in as-deposited state. Thickness of the layers 12 and 14 can be of about 1.5 nm and 2 nm, respectively. The tunnel barrier layer 16 can be made of MgO and have a thickness of about 1.1 nm. The seed layer 18 and the cap layer 19 can have a thickness of about 5 nm each, and can be made of tantalum (Ta) and tungsten (W), respectively.

The tunnel barrier layer 16 being sandwiched by the as-deposited amorphous CoFeVB free and pinned layers can crystallize first into a body-centered cubic (bcc) structure during post-deposition annealing at a temperature of about 350° C. within about one hour. A magnetic field directed in-plane or perpendicular to the layer plane can be applied during annealing. The crystallized MgO layer 16 can serve as a template during following crystallization of the amorphous CoFeVB magnetic layers. The sharp and flat interfaces of the MgO layer with adjacent CoFeVB layers can produce a substantial magnetic surface anisotropy. The interfacial anisotropy can direct the magnetization direction in the CoFeVB layers 12 and 14 substantially perpendicular to the layer surface. Intrinsic demagnetizing field of the ferromagnetic free 12 and pinned 14 layers resists to the perpendicular direction of the magnetization in favor of the in-plane direction.

The magnetization direction in the ferromagnetic layer is defined by an effective magnetic anisotropy $K_{EFF}$ that takes into consideration a joint effect of the interfacial $K_S$ and volume $K_V$ anisotropies. The effective anisotropy can be estimated from:

$$K_{EFF} > K_S/t - 2\pi M_S^2, \quad (2)$$

where a term $2\pi M_S^2$ represents the shape anisotropy, t and $M_S$ is a thickness and saturation magnetization of the magnetic layer, respectively. When $K_{EFF} > 0$, the perpendicular direction of the magnetization is favored. $K_{EFF}$ is inverse proportional to the thickness t and saturation magnetization $M_S$ of the magnetic layer.

Solution of the equations (1) and (2) for $M_S$ leads to:

$$M_S \leq \sqrt{\frac{1}{2\pi t}\left(K_S + \frac{4\Delta k_B T}{\pi D^2}\right)} \quad (3)$$

where D is a diameter of the MTJ.

Magnetoresisitance $\Delta R/R$ increases with the free layer thickness. Required $\Delta R/R \geq 150\%$ can be achieved at the thickness of the free layer $t \geq 1.5$ nm. According to S. Ikeda et al., IEEE Transactions on Magnetics v. 48, p. 3829 (2012), the interfacial anisotropy $K_S$ in Ta/CoFeB/MgO system is of about 1.5 erg/cm². Hence, the required thermal stability factor $\Delta = 60$ along with a perpendicular magnetization direction in the MTJ having a diameter D=45 nm can be provided at $M_S \leq 1150$ emu/cm³.

Theory and experiment suggest that high TMR and low spin-polarized switching current $I_S$ can be achieved in the MgO-based MTJ having a coherent bcc structure with (001) plane oriented. Crystalline structure of the seed and cap layers having a direct contact with the free and pinned magnetic layers can affect the structure of the annealed free and pinned layers. To promote the crystallization of the as-deposited amorphous CoFeVB layers into required bcc(001) texture the seed and cap layer can have bcc or amorphous structure.

Addition of V (vanadium) to the free and pinned layers can reduce a lattice mismatch between MgO and crystallized magnetic layers. This can lead to the increase of TMR and reduction of the spin-polarized current. Moreover, vanadium can support the crystallization of the magnetic layers into the required bcc texture.

The saturation magnetization $M_S$ of the CoFeVB alloy reduces almost linearly with vanadium concentration increase. $M_S$ reduction can promote the perpendicular direction of the magnetization in the free and pinned layers.

The seed 18 and cap 19 layers of the MTJ 10 can be made of a nonmagnetic conductive material comprising at least one element selected from the group consisting of Ta, W, Nb, Mo, V, Cr, and Hf. These metals can have a stable bcc or amorphous structure that may be important for promoting the crystallization of the CoFeVB free and pinned layers into the required texture. Moreover, the nonmagnetic seed and cap layers made of these metals and having direct contacts with the free and pinned layers can support the perpendicular direction of the magnetization in the magnetic layers due to magnetic surface anisotropy.

The magnetic surface anisotropy depends on the crystalline structure of the contacting materials, as well on flatness and sharpness of the interface. These parameters depend on contacting materials, sputtering and annealing conditions.

Hence, the joint effect of the magnetic surface anisotropy produced at the MgO/CoFeVB and CoFeVB/W interfaces of the free layer 12 with the adjacent tunnel barrier 16 and cap 19 layers along with the reduced demagnetizing field due to a lower $M_S$ can provide the required perpendicular direction of the magnetization $M_{12}$ of the free layer 12. Respectively, the interfaces Ta/CoFeVB and CoFeVB/MgO of the pinned layer 14 with adjacent seed 18 and tunnel barrier 16 layers and reduced $M_S$ can direct the magnetization $M_{14}$ of the pinned layer perpendicular to the layer surface.

Theory and experiment suggest that a perpendicular magnetic anisotropy in CoFeB/MgO/CoFeB multilayer mostly originates from the CoFeB/MgO and MgO/CoFeB interfaces. More specifically, the perpendicular magnetic anisotropy can be originated from spin-orbit coupling of an oxygen and transition metal (Fe—O or Co—O) produced at the interfaces. This suggests that the perpendicular magnetic anisotropy in the free magnetic layer can be enhanced by sandwiching the layer between two oxide layers including MgO on one side as the tunnel barrier layer and conductive oxide layer on the other side. According to K. Conder "Electronic and ionic conductivity in metal oxides". PSI, Switzerland (2015), a conductivity of the conductive oxides varies in a range from $10^2$ $\Omega^{-1} \cdot m^{-1}$ to $10^7$ $\Omega^{-1} \cdot m^{-}$, which corresponds to a resistively range from 1 $\Omega \cdot cm$ to $10^{-5}$ $\Omega \cdot cm$. Respectively, the conductivity of the semiconductor oxides varies in the range from $1 \cdot 10^{-3}$ to $1 \cdot 10^2$ $\Omega^{-1} \cdot m^{-1}$, that corresponds to the resistivity range from $1 \cdot 10^5$ $\Omega \cdot cm$ to 1 $\Omega \cdot cm$. the conductivity of the isolative oxides is smaller than $1 \cdot 10^{-8} \Omega^{-1} \cdot m^{-}$. The same is true for the pinned magnetic layer. The enhanced perpendicular magnetic anisotropy can support a perpendicular magnetization direction in the free layer having a reduced $M_S$ and thickness up to about 2 nm that is essential for thermal stability, scalability, TMR ratio and other parameters of MRAM. The layers 18 and 19 can be made from conductive oxides providing a perpendicular anisotropy in the adjacent free and pinned magnetic layers, promoting their crystallization into bcc (001) structure and having a low resistance. For example, the layers 18 and 19 can be made of 15-nm thick films of an indium-tin-oxide $In_2O_3$—$SnO_2$ having a resistivity of about $8 \cdot 10^{-4}$ $\Omega \cdot cm$.

Writing data to a free layer 12 can be provided by a spin-polarized current $I_S$ running through the MTJ 10 in the direction perpendicular to layer plane. The direction of the reversible magnetization $M_{12}$ can be effectively controlled by the direction of the switching current $I_S$. More specifically, when the spin-polarized current $I_S$ flows from the free layer 12 to the pinned layer 14 through the tunnel barrier layer 16 (downward arrow), the conductance electrons run in the opposite direction from the pinned layer 14 to the free layer 12. The electrons storing a spin information of the pinned layer 14 are injected into the free layer 12. A spin angular momentum of the injected electrons is transferred to electrons of the free layer 12 in accordance with the law of spin angular momentum conservation. This forces the magnetization direction of the free layer 12 to be oriented in parallel with the magnetization direction of the pinned layer 14 (logic "0").

On the other hand, when the spin-polarized write current $I_S$ flows from the pinned layer 14 to the free layer 12 (upward arrow), the spin-polarized electrons run in the opposite direction from the free layer 12 to the pinned layer 14. The electrons having spin oriented in parallel to the magnetization direction of the pinned layer 14 are transmitted. The electrons having spin antiparallel to the magnetization direction of the pinned layer 14 are reflected. As a result, the magnetization orientation of the free layer 12 is forced to be directed antiparallel to the magnetization direction of the pinned layer 14 (logic "1").

Reading of the data stored in the MR element 10 is provided by measuring its resistance and comparing it with the resistance of the reference element (not shown).

Figure 2:
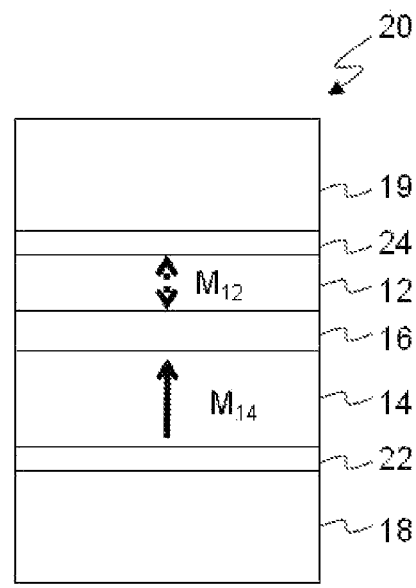
FIG. 2 shows a schematic sectional view of a perpendicular magnetic tunnel junction according to another embodiment of the present disclosure.

FIG. 2 shows a schematic sectional view of MTJ 20 according to another embodiment of the present disclosure. The MTJ 20 distinguishes from the MTJ 10 shown in FIG. 1 by further comprising interface magnetic layers 22 and 24 that can be made of $Co_{20}Fe_{70}V_{10}$. Thickness of the layers 22 and 24 can be of about 0.5 nm each. The layers 22 and 24 can have a crystalline bcc or amorphous structure in as-deposited state.

The layer 22 can be disposed in-between the seed layer 18 and the pinned layer 14. The layer 22 can have a substantial ferromagnetic exchange coupling with the ferromagnetic pinned layer 14. The layer 22 can promote the magnetic surface anisotropy $K_S$ at the interface with the seed layer 18. The layer 22 can also promote the crystallization of the as-deposited amorphous pinned layer 14 into the required bcc structure during post-deposition annealing.

The layer 24 can be disposed in-between the cap layer 19 and the free layer 12 that also can have an amorphous or crystalline structure in the as-deposited state. The layer 24 can produce a substantial ferromagnetic exchange coupling with the free layer 12. The layer 24 can promote the magnetic surface anisotropy at the interface with and the cap layer 19. Moreover, the layer 24 can promote the crystallization of the free layer 12 in the required bcc structure during annealing. Hence, the interface magnetic layers 22 and 24 can promote both the perpendicular magnetization direction in the pinned 14 and free 12 layers, respectively, and their crystallization into the required bcc structure. These conditions are essential for thermal stability, high TMR and low spin-polarized switching current of the perpendicular MTJ 20.

The MTJ 10 (FIG. 1) and MTJ 20 (FIG. 2) can suffer from a substantial magnetic leakage field produced by the pinned layer 14 in the vicinity of the free layer 12. The leakage field can cause a degradation of the thermal stability and uneven magnitudes of the spin-polarized switching current of the MTJ. For example, the spin-polarized current required for magnetization direction reversal from antiparallel to parallel configuration (from logic state "1" to the logic state "0") can be not equal to the current required for switching from parallel to antiparallel configuration (from logic "0" to logic "1"). Accordingly, a reduction of the leakage field produced by the pinned layer is essential for performance of the MTJs.

Figure 3:
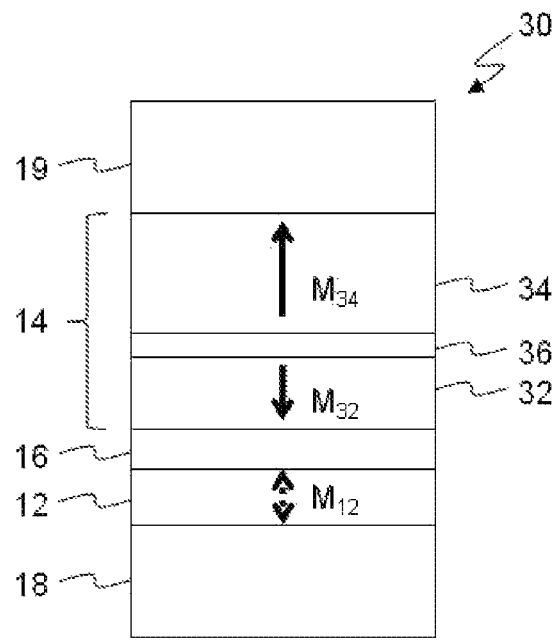
FIG. 3 shows a schematic sectional views of a magnetic tunnel junction with a perpendicular magnetic anisotropy according to yet another embodiment of the present disclosure.

FIG. 3 shows a schematic sectional view of MTJ 30 according to yet another embodiment of the present disclosure. The MTJ 30 comprises a free layer 12, a pinned layer 14, a tunnel barrier layer 16 disposed in-between the pinned 14 and free 12 layers, a seed layer 18, and a cap layer 19. To provide a cancellation of the leakage magnetic field produced by the pinned layer 14 in the vicinity of the free layer 12, the pinned layer 14 can comprise a structure of a synthetic antiferromagnet (SAF). The SAF pinned layer 14 can comprise a pinning magnetic layer 34 that is substantially antiferromagnetically exchange coupled to a reference magnetic layer 32 through a nonmagnetic spacer layer 36. The pinning layer 34 can have a fixed magnetization direction $M_{34}$ directed antiparallel to the direction of the magnetization $M_{32}$ of the reference layer 32.

The free layer 12 and the reference layer 32 can be made of $(Co_{20}Fe_{70}V_{10})_{85}B_{15}$ alloy and have a coercivity of about 200 Oe and a thickness of about 1.5 nm and 2 nm, respectively. The tunnel barrier layer 16 can be made of MgO and have a thickness of about 1.1 nm. The pinning magnetic layer 34 can be made of $[(Co_{30}Fe_{70}(0.25\ nm)/Pt(0.2\ nm)_8/(Co_{30}Fe_{70}(0.5\ nm)]$ laminates and have a coercivity of about 2000 Oe. The spacer layer 36 can be made of Cr and have a thickness of about 0.7 nm. The seed layer 18 can be made of indium-tin-oxide $In_2O_3$—$SnO_2$ (ITO) and have a thickness of about 15 nm. The cap layer 19 can be made of Pt and have a thickness of about 5 nm. The layers 18 and 19 can produce a substantial magnetic surface anisotropy at their interfaces with the free 12 and pinned 14 layers, respectively. The spacer layer 36 can have a bcc structure to promote the crystallization of the as-deposited amorphous CoFeVB reference layer 32 into the required bcc structure. Moreover, the Cr spacer layer 36 can promote the perpendicular anisotropy in the pinned layer 14 by means of both the interfacial magnetic anisotropy with the reference layer 32 and antiferromagnetic exchange coupling with the pinning layer 34. The joint effect of the magnetic surface anisotropy and antiferromagnetic exchange coupling can prevent reversal of the magnetization direction $M_{32}$ of the reference layer 32 during writing.

The magnetization directions of the reference layer $M_{32}$ and pinning layer $M_{34}$ are directed antiparallel to each other. This configuration of the magnetization directions can provide an effective cancelation of the leakage magnetic field in the vicinity of the free layer 12. That is essential for the reduction of the spin-polarized switching current $I_S$ asymmetry and thermal stability increase of the MTJ 30.

Figure 4:
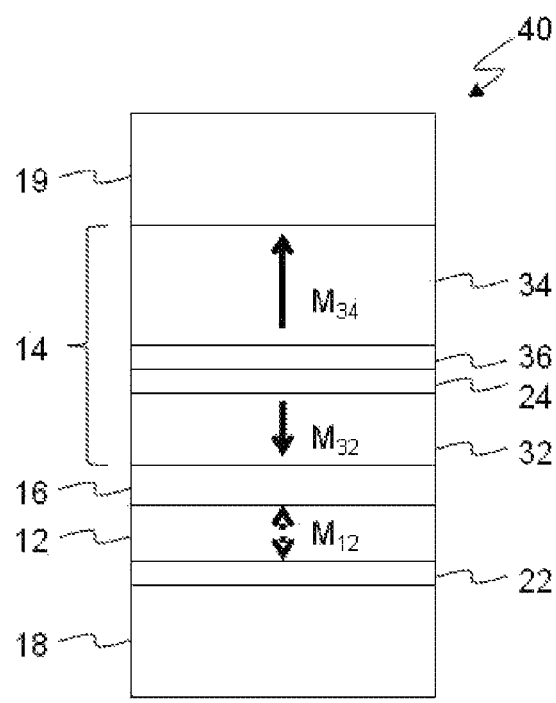
FIG. 4 illustrates a schematic sectional view of a perpendicular magnetic tunnel junction according to still another embodiment the present disclosure.

FIG. 4 shows a schematic sectional view of MTJ 40 according to still another embodiment of the present disclosure. The MTJ 40 distinguishes from the MTJ 30, shown in FIG. 3, by use of interface magnetic layers 22 and 24 that can have a crystalline bcc or amorphous structure. The magnetic layers 22 and 24 can be disposed adjacent to the free 12 and reference 32 layers, respectively, and have a substantial ferromagnetic exchange coupling with these layers. The layers 22 and 24 can be made of $Co_{20}Fe_{70}V_{10}$ alloy and have thickness of about 0.5 nm.

The layer 22 can improve the magnetic surface anisotropy at the interface with the seed layer 18. This can result in improvement of the thermal stability of the free layer 12 through the ferromagnetic exchange coupling with the interface layer 22. The layer 24 can be disposed in-between the reference layer 32 made of CoFeVB and the spacer layer 36 made of Ru. The layer 24 can promote antiferromagnetic exchange coupling between the reference 32 and pinning 34 magnetic layer. Moreover, the layers 22 and 24 can promote the crystallization of the layers 12 and 32 into the required bcc structure during annealing.

Figure 5:
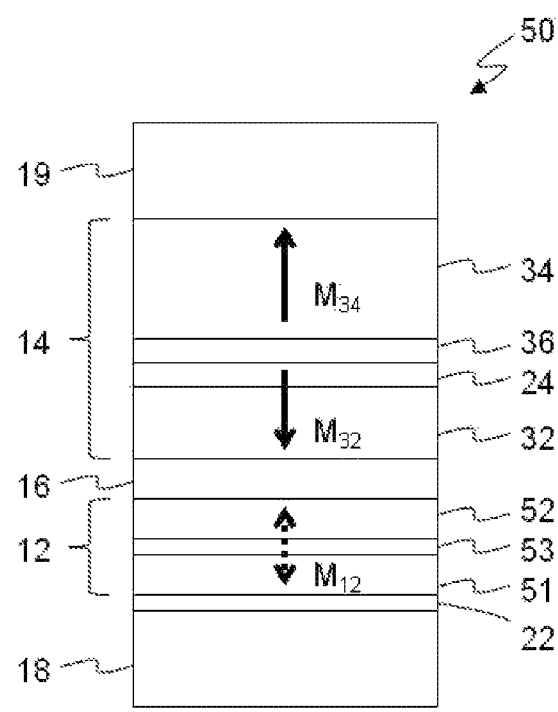
FIG. 5 shows a schematic sectional view of a magnetic tunnel junction with a perpendicular anisotropy comprising a laminated free layer according to still another embodiment of the present disclosure.

FIG. 5 shows a schematic sectional view of a perpendicular MR element 50 according to still another embodiment of the present disclosure. The element 50 distinguishes from the MR element 40 shown in FIG. 4 by use of the free layer 12 comprising a multilayer structure. The free layer 12 can be made of two magnetic sublayers 51 and 52 separated from each other by a thin nonmagnetic spacer sublayer 53. For example, the magnetic sublayers 51 and 52 can be made of CoFeVB that can have an amorphous structure in as-deposited state and a thickness of about 0.8 nm each. The spacer sublayer 53 can be made of vanadium (V) and have a thickness of about 0.2 nm. During annealing the spacer sublayer 53 can promote crystallization of the sublayers 51 and 52 into required bcc (001) texture. The spacer layer 53 can also enhance the perpendicular anisotropy in the free layer 12 by means of magnetic surface anisotropy at CoFeVB/V interfaces. Moreover, the vanadium can diffuse from the spacer sublayer 53 into the adjacent magnetic sublayers 51 and 52 causing a reduction of their magnetization saturations. The magnetic sublayers 51 and 52 are exchange coupled to each other and behave as one magnetic layer. The number of the sublayers 51, 52 and 53 in the free layer 12 can be any.

The magnetic layers 12, 14, 32 and 52 of the MTJ 10-50 can be made of magnetic materials having a substantial spin polarization p, low damping constant α, reduced magnetization saturation $M_S$ (about 1150 emu/cm$^3$ or less after annealing) and supporting a perpendicular direction of the magnetization. More specifically, the layers 12, 14, 32 and 52 can be made of the ferromagnetic materials having an amorphous structure in as-deposited state and capability to crystallize into predominantly bcc (001) texture during annealing. The materials of the layers 12, 14, 32 and 52 can contain at least one element selected from the group consisting of Fe, Co, and Ni, at least one element selected from the group consisting of V, Mo, and Cr, and at least one element selected from the group consisting of B, C, P and Si. For example, such materials can include CoFeCrB, FeCoVP, FeVB, FeCrB, FeVP, CoFeMoB, and the like. Thickness of the layers 12, 14, 32 and 52 can be in a range from about 0.5 nm to about 5 nm. Amount of the elements of the group consisting of V, Mo, and Cr can be up to 40 at. % including. The amount of the elements selected from the group consisting of B, C, P, and Si can be up to 30 at. % including.

The tunnel barrier layer 16 can be made of an oxide having NaCl structure as a stable crystalline phase. For example, such materials can include MgO, CaO, SrO, TiO, VO, and NbO. In order to form a coherent bcc (001) texture with the adjacent free and pinned ferromagnetic layers it is preferable to select the insulating material that shows a lattice mismatch of 5% or less in (100) face with the ferromagnetic layers. Thickness of the layer 16 can be in a range from about 0.5 nm to about 2.5 nm.

The seed layer 18 can be made of a material selected from the group consisting of Ta, W, Nb, Mo, Cr, V and Hf, their based laminates and/or alloys. The seed layer can be used to control a crystalline structure of the MTJ stack, more specifically, the crystalline structure of the free and pinned layers. Moreover, the seed layer material may be able to provide a substantial magnetic surface anisotropy with the contacting magnetic layer. Also the seed layer 18 can be made of conductive oxides, for example, the oxides of transition metals such as Ti, V, Cr, Co, Ni, Cu, Zn, Zr, Nb, Mo, Ru, Cd, Hf, Ta, W, and similar, transparent conductive oxide (TCO) such as indium-tin-oxide $In_2O_3$—$SnO_2$ (ITO), $SrVO_3$, $In_2O_3$-based ozides, ZnO-based oxides, CdO-based oxides and similar, $CuMO_2$ oxides (where M=B, Al, In, Ga) and similar, perovskite oxides $CaTiO_3$, $SrTiO_3$, $LaTiO_3$ and similar. The seed layer can be used as a bottom electrode as well. Thickness of the layer seed layer 18 can vary in a range from about 0.5 nm to about 50 nm. Resistivity of the conductive oxides can be in a range of about $1$-$1\cdot10^{-5}$ Ω·cm.

The cap layer 19 mainly functions as a protective layer for the MTJ stack or as a top electrode. The cap layer can be made of a material comprising at least one element selected from the group consisting of Ta, W, Nb, Mo, Cr, V, Hf, their based laminates and/or alloys. The cap layer can support crystallization of the amorphous magnetic layers adjacent to the tunnel barrier layer into the required bcc structure. The cap layer may also produce a substantial magnetic surface anisotropy to support a perpendicular direction of the magnetization in the contacting magnetic layer. The cap layer 19 can be made of conductive oxides, for example, the oxides of transition metals such as Ti, V, Cr, Co, Ni, Cu, Zn, Zr, Nb, Mo, Ru, Cd, Hf, Ta, W and similar, transparent conductive oxide (TCO) such as indium-tin-oxide $In_2O_3$—$SnO_2$ (ITO), $SrVO_3$, $In_2O_3$-based oxides, ZnO-based oxides, CdO-based oxides and similar, $CuMO_2$ oxides (where M=B, Al, In, Ga) and similar, perovskite oxides $CaTiO_3$, $SrTiO_3$, $LaTiO_3$ and similar. The seed layer can be used as a bottom electrode as well. Thickness of the layer seed layer 18 can vary in a range from about 0.5 nm to about 50 nm. In some cases, when the required bcc crystalline structure of the pinned and free magnetic layers is preserved, the cap layer can be made of Pt and Pd.

The magnetic layer 22 and 24 can be made of magnetic material with a preferable bcc crystalline structure. The magnetic material can comprise at least one element selected from the group consisting of Fe, Co, and Ni, and at least one element selected from the group consisting of V, Cr, and Mo, their based alloys and/or laminates. Concentration of the nonmagnetic elements in the magnetic material can be up 40 at. % including. Thickness of the layers 22 and 24 can be in a range from about 0.2 nm to about 2.5 nm.

The pinning layer 34 can be made of material having a substantial perpendicular anisotropy and comprising at least one element selected from the group consisting of Fe, Co, and Ni, and at least one element selected from the group consisting of Ta, W, Cr, Pt, and Pd, their based alloys and/or laminates. Fox example, the pinning magnetic layer 34 can be made of the alloys FePt, FePd, CoPt, CoPd, CoCrPt, CoNiPt, CoPtTa, CoPtTa—$SiO_2$, and the like, and/or the laminates Co/Pt, CoFe/Pt, Co/Pd, Co/Ni, Fe/W, CoFe/Ta, and the like. Thickness of the pinning layer 34 can be in a range from about 1 nm to about 100 nm.

The nonmagnetic spacer layer 36 can be made of a nonmagnetic metal that can provide a substantial antiferromagnetic exchange coupling between the ferrromagnetic pinned and pinning layers. For example, the nonmagnetic spacer layer can be made of a material selected from the group consisting of Ta, W, Nb, Mo, Cr, V, Ru, Re, Rh, Cu, Cr, Ir, their based alloys and/or laminates. Thickness of the layer 36 can be in a range from about 0.2 nm to about 3 nm.

The magnetic sublayers 51 and 52 can be made of similar materials as the magnetic layers 12, 14 and 32. Thickness of the sublayers 51 and 52 can be in a range from about 0.2 nm to about 1 nm.

The nonmagnetic spacer sublayer 53 can be made of a nonmagnetic metal that can provide exchange coupling between ferromagnetic sublayers, reduce magnetization saturation and support perpendicular anisotropy and bcc (001) texture in the ferromagnetic sublayers. For example, the spacer sublayer can be made of V, Cr, Mo, W their based alloys and laminates. Thickness of the sublayer 53 can be in a range of about 0.2 nm and 1 nm.

While the specification of this disclosure contains many specifics, these should not be construed as limitations on the scope of the disclosure or of what may be claimed, but rather as descriptions of features specific to particular embodiments. Certain features that are described in this specification

What is claimed is:

1. A magnetoresistive element comprising:
a free ferromagnetic layer comprising a reversible magnetization direction directed substantially perpendicular to a film surface in its equilibrium state;
a pinned ferromagnetic layer comprising a fixed magnetization direction directed substantially perpendicular to the film surface;
a nonmagnetic tunnel barrier layer disposed between the free ferromagnetic layer and the pinned ferromagnetic layer and having a direct contact with the free and pinned ferromagnetic layers;
a first nonmagnetic conductive layer having a direct contact with a side of the free ferromagnetic layer opposite to the tunnel barrier layer and comprising an oxide of at least one element selected from the group consisting of In, Cd, Zn, and Sn; and
a second nonmagnetic conductive layer disposed adjacent to a side of the pinned ferromagnetic layer opposite to the tunnel barrier layer,
wherein the free ferromagnetic layer and the pinned ferromagnetic layers comprise at least one element selected from the group consisting of Fe, Co, and Ni, at least one element selected from the group consisting from V, Cr, and Mo, and at least one element selected from the group consisting of B, P, C, and Si,
wherein the free ferromagnetic layer, the tunnel barrier layer, and the pinned ferromagnetic layer having a coherent body-centered cubic (bcc) structure with a (001) plane oriented; and
wherein the first nonmagnetic conductive layer has a resistivity smaller than 1 Ω·cm.

2. The magnetoresistive element of claim 1, wherein the second nonmagnetic conductive layer comprising a conductive oxide having a resistivity smaller than 1 Ω·cm and a direct contact with the pinned ferromagnetic layer.

3. The magnetoresistive element of claim 1, wherein the pinned ferromagnetic layer comprises a synthetic antiferromagnetic.

4. The magnetoresistive element of claim 1, wherein the free ferromagnetic layer comprises:
a first magnetic sublayer;
a second magnetic sublayer; and
a nonmagnetic spacer sublayer disposed between the first and second magnetic sublayers, having direct contacts with the first and second magnetic sublayers, comprising at least one element selected from the group consisting of V, Cr, Nb, Mo, Ta, and W, and supporting a bcc (001) texture in the first and second magnetic sublayers,
wherein the first magnetic sublayer and the second magnetic sublayer are exchange coupled and behave as one magnetic layer.

5. The magnetoresistive element of claim 1, wherein the free ferromagnetic layer having a thickness greater than 1.5 nm and comprises a material has a magnetization saturation smaller than 1150 emu/cm$^3$.

6. A magnetoresistive element comprising:
a free ferromagnetic layer comprising a reversible magnetization direction directed substantially perpendicular to a film surface in its equilibrium state;
a pinned ferromagnetic layer comprising a fixed magnetization direction directed substantially perpendicular to the film surface;
a nonmagnetic tunnel barrier layer disposed between the free ferromagnetic layer and the pinned ferromagnetic layer and having a direct contact with the free and pinned ferromagnetic layers;
a first nonmagnetic conductive layer disposed adjacent to and having a direct contact with a side of a free ferromagnetic layer opposite to the tunnel barrier layer, comprising a conductive oxide including at least one element selected from the group consisting of In, Cd, Zn, and Sn, and having a resistivity smaller than 1 Ω·cm; and
a second nonmagnetic conductive layer disposed adjacent to a side of the pinned ferromagnetic layer opposite to the tunnel barrier layer.

7. The magnetoresistive element of claim 6, wherein the pinned ferromagnetic layer comprising:
a first magnetic layer disposed adjacent to the tunnel barrier layer;
a second magnetic layer has a substantial perpendicular anisotropy; and
a nonmagnetic spacer layer disposed between the first and second magnetic layers and providing a substantial antiferromagnetic exchange coupling between the first and second magnetic layers.

* * * * *